(12) United States Patent
Tanaka et al.

(10) Patent No.: US 6,646,350 B2
(45) Date of Patent: Nov. 11, 2003

(54) SEMICONDUCTOR DEVICE

(75) Inventors: Naotaka Tanaka, Tokyo (JP); Hideo Miura, Tokyo (JP); Yoshiyuki Kado, Tokyo (JP); Ikuo Yoshida, Tokyo (JP); Takahiro Naito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/922,230

(22) Filed: Aug. 3, 2001

(65) Prior Publication Data

US 2002/0072145 A1 Jun. 13, 2002

(30) Foreign Application Priority Data

Aug. 4, 2000 (JP) .......................... 2000-236467

(51) Int. Cl.[7] ...................... H01L 23/52; H01L 21/4763
(52) U.S. Cl. ..................... 257/759; 257/747; 438/623
(58) Field of Search ...................... 257/688, 736–739, 257/747, 748, 753, 759, 766, 780–786; 438/118, 119, 149–160, 455, 479, 482, 488, 623, 628, 781

(56) References Cited

FOREIGN PATENT DOCUMENTS

JP          10-270496          10/1998

Primary Examiner—Caridad Everhart
Assistant Examiner—Calvin Lee
(74) Attorney, Agent, or Firm—Townsend and Townsend and Crew LLP

(57) ABSTRACT

In order to realize a semiconductor device and a manufacturing method thereof which can keep with a high reliability an electric connection between each of bump pads formed on LSI chips and each of electrode pads formed on an interconnection substrate, within an guaranteed temperature range, a thermal expansion coefficient of an adhesive (3) is in the range of 20 to 60 ppm, and an elastic modulus of a build-up portion (6) is in the range of 5 to 10 GPa. Further, the build-up portion (6) is constituted by a multi-layer build-up substrate in which buid-up portion a peak value (a glass transition temperature) of a loss coefficient exists within a range of 100° C. to 250° C. and does not exist within a range of 0° C. to 100° C. By setting or selecting the physical properties in the manner disclosed above, it is possible to realize a semiconductor device and a manufacturing method thereof which can keep with a high reliability an electric bonding between the bump pads (2) formed on the LSI chips (1) and the electrode pads (4) on the interconnection substrate (5) within an guaranteed temperature range.

12 Claims, 6 Drawing Sheets

1 : LSI CHIP
2 : BUMP ELECTRODES (Au)
3 : ADHESIVE
4 : SUBSTRATE PADS
5 : SUBSTRATE CORE
6 : SUBSTRATE SURFACE LAYER
    (BULD-UP PORTION)

INFLUENCE OF THERMAL EXPANSION COEFFICIENT OF ADHESIVE ON THE LEVEL OF STRAIN OCCURRING IN Au BUMP CONTACT FACE

MEASUREMENT EXAMPLES OF STORAGE ELASTIC MODULUS AND LOSS COEFFICIENT BY DMA MEASUREMENT OF BUILD-UP PORTION

EXAMPLE OF MEASUREMENT OF STRESS-RELAXING AFTER KEEPING THE PREVIOUS STRAIN OF THE BUILD-UP PORTION

SEMICONDUCTOR DEVICE

BACKGROUND OF THE INVENTION

The present invention relates to a mounting structure and a method of producing a semiconductor device.

In an assembly by flip chip bonding in which a LSI is directly mounted on an interconnection substrate by metal bumps or the like, there has been generally employed a method of melting-and-bonding the LSI chip with solder bumps mounted thereon to the interconnection substrate by use of reflow heating.

This method is performed mainly for the reason of such advantages on process as the solder is melted at a relatively low temperature and as it is possible to compensate, because of the self-alignment effect, positional deviations caused at the time of mounting the LSI chip.

However, in the case where the interconnection substrate is an organic, plastic substrate, large thermal strain is caused in the solder bumps due to a difference of thermal expansion coefficient between the LSI chip and the interconnection substrate, and there occurs such a fear as fatigue fracture is caused at the solder-bonding portions during a temperature cycle test or the like.

As means for preventing this phenomenon, there has been usually performed a method (, that is, a mounting method generally called as an underfill structure)in which a gap defined between the LSI chip and the interconnection substrate is filled with an epoxy thermosetting resin having fine particles (generally called as a filler) added thereto, to thereby restrain deformation caused due to the difference of thermal expansion between the LSI chip and the interconnection substrate, whereby the thermal strain caused in the solder bumps is reduced and the bonding reliability thereof during the temperature cycle thereof.

However, in the mounting method by use of the underfill structure, there is needed an additional step of filling the gap with the resin after mounting the LSI chip on the interconnection substrate, so that there is caused a problem that a production cost is increased.

In particular, in such a case of mounting a plurality of chips as in a multi-chip module (MCM), the resin-filling process is needed regarding each of the chips, so that a great loss is caused regarding the tact for the mass production thereof as well as the cost.

Accordingly, in recent years, there is noted a mounting method called a flip chip attach method (hereinafter, simply refer to an FCA method) in which the preoduction steps are simplified.

The FCA method is explained below while referring to JP-A-10-270496, the entire contents of which are incorporated herein by reference.

In this publication, there is shown a schematic cross sectional view of a semiconductor device in which bump pads formed on the electrode pads of a LSI chip are made to be in pressure contact with the electrode pads of the interconnection substrate, so that they are electrically connected.

Specifically, each of the bump pads is formed on each of the electrode pads formed on the LSI chip. Next, a film-like adhesive made of a thermosetting resin is temporarily pressure-bonded onto each of the electrode pads formed on the interconnection substrate. Finally, the LSI chip is mounted at a position at which the bump pads on the LSI chip correspond to the electrode pads on the interconnection substrate and is simultaneously contacted therewith under heating-and-pressure, and the resin is cured in a state in which each of the bump pads is in pressure contact with each of the electrode pads of the interconnection substrate.

By the cooling performed from the temperature of the pressure-contact, there occur heat shrinkage and curing shrinkage in the resin, and contact pressure is generated between each of the bump pads and each of the electrode pads formed on the interconnection substrate. Because of the contact pressure, the bump pads are electrically connected to the electrode pads formed on the interconnection substrate.

SUMMARY OF THE INVENTION

In the FCA method, since the bump pads and the electrode pads on the interconnection substrate are not bonded by alloying, there does not occur such a phenomenon as large thermal strain is caused on each of the bump pads due to the difference of thermal expansion between the LSI chip and the interconnection substrate.

Accordingly, since no underfill step is needed and since the period of time of the pressure-contact is short, the production cost can be reduced to a low level. In addtion, in the method, it is possible to address the fine-connecting-pitch design expected to proceed rapidly in the future, and it is possible to perform the test under a state of semi-cured state of the resin, so that it becomes easy to perform the testing and repairing of the semiconductor device.

Further, because of so-called "flux-less" and "lead-less" achieved in the FCA method, there is an advantage that an influence of alpha rays and an influence on the environment can be reduced.

However, on the other hand, since in the FCA method the bump pads are electrically connected to the electrode pads of the interconnection substrate by the contact pressure, not by alloying, there occurs a problem that the contact pressure is lost within an guaranteed temperature range of the semiconductor device due to the influence of the thermal expansion difference caused between the metal bump pads and the adhesive used to seal them, so that electrical disconnection is caused.

To address the problem mentioned above, it is performed, in the prior arts, to select an adhesive having a proper physical property, which is however preformed only experientially by repeating the trial manufacture or the like.

Thus, in the invention is analyzed, by use of the structural analysis, the respect as to how the contact pressure, which is obtained after the steps of the pressure-contacting and the curing achieved between each of the bump pads formed on the LSI chip and each of the electrode pads formed on the interconnection substrate, is varied due to the variation of various boundary conditions occurring between each of the bump pads and each of the electrode pads. In addition, the inventors of the invention have researched essential respects for obtaining such a structure as to bring about the contact pressure sufficient within the guaranteed temperature range of the semiconductor device. As the results thereof, the inventors of the invention have found out a method for making it possible to address the problem of the prior arts and have realized a semiconductor device having a mounting structure which is capable of addressing the problem of the prior arts.

An object of the present invention is to realize a semiconductor device which can keep with high reliability, within an guaranteed temperature range, the electric connection between each of the bump pads formed on the LSI chip and each of the electrode pads formed on the interconnection substrate, and a manufacturing method thereof.

According to the first to seventh aspects of the present invention, there are provided the following semiconductor devices and methods.

(1) A semiconductor device comprising
  at least one LSI chip provided on an electrode pad face thereof with metallic bump pads, and
  a multi-layer interconnection substrate having an outermost layer formed of an organic portion which substrate is provided on the organic portion thereof with metallic electrode pads each located in a position corresponding to that of each of said bump pads of the LSI chip,
  each of the bump pads of the LSI chip being in pressure contact with each of the electrode pads of the interconnection substrate through an adhesive so that each of the bump electrodes is electrically connected to each of the electrode pads formed in the interconnection substrate,
  the adhesive having a thermal expansion coefficient ranging from 20 to 60 ppm when measured by TMA measurement, so that each of the bump pads and each of the electrodes pads formed on the multi-layer interconnection substrate is in electrical contact with each other within an elastic deformation range of each of the bump pads and electrode pads at a cooling lower limit temperature defined within a guaranteed temperature range of the semiconductor device,
  the organic portion having at a room temperature circumstance a storage elastic modulus ranging from 5 to 10 GPa when measured by DMA measurement,
  said organic portion further having a peak value of a loss coefficient, which peak value is equivalent to a glass transition temperature thereof, in a range of 100° C. to 250° C. when measured by the DMA measurement and having no peak value of the loss coefficient in another range of 0° C. to 100° C.

(2) A semiconductor device comprising
  at least one LSI chip provided on an electrode pad face thereof with metallic bump pads, and
  a multi-layer interconnection substrate having an outermost layer formed of an organic portion which substrate is provided on the organic portion thereof with metallic electrode pads each located in a position corresponding to that of each of the bump pads of the LSI chip,
  each of the bump pads of the LSI chip being in pressure contact with each of the electrode pads of the interconnection substrate through an adhesive so that each of the bump electrodes is electrically connected to each of the electrode pads formed in the interconnection substrate,
  the adhesive having a thermal expansion coefficient ranging from 20 to 60 ppm when measured by TMA measurement, so that each of the bump pads and each of the electrodes pads formed on the multi-layer interconnection substrate is in electrical contact with each other within an elastic deformation range of each of the bump pads and electrode pads at a cooling lower limit temperature defined within a guaranteed temperature range of the semiconductor device,
  the organic portion having at a room temperature circumstance a storage elastic modulus ranging from 5 to 10 GPa when measured by DMA measurement.

(3) A semiconductor device comprising
  at least one LSI chip provided on an electrode pad face thereof with metallic bump pads, and
  a multi-layer interconnection substrate having an outermost layer formed of an organic portion which substrate is provided on the organic portion thereof with metallic electrode pads each located in a position corresponding to that of each of the bump pads of the LSI chip,
  each of the bump pads of said LSI chip being in pressure contact with each of the electrode pads of the interconnection substrate through an adhesive so that each of the bump electrodes is electrically connected to each of the electrode pads formed in the interconnection substrate,
  the adhesive having a thermal expansion coefficient ranging from 20 to 60 ppm when measured by TMA measurement, so that each of the bump pads and each of the electrodes pads formed on the multi-layer interconnection substrate is in electrical contact with each other within an elastic deformation range of each of the bump pads and electrode pads at a cooling lower limit temperature defined within a guaranteed temperature range of the semiconductor device,
  the organic portion having a peak value of a loss coefficient, which peal value is equivalent to a glass transition temperature thereof, in a range of 100° C. to 250° C. when measured by the DMA measurement and having no peak value of the loss coefficient in another range of 0° C. to 100° C.

(4) A semiconductor device comprising
  at least one LSI chip provided on an electrode pad face thereof with metallic bump pads, and
  a multi-layer interconnection substrate having an outermost layer formed of an organic portion which substrate is provided on the organic portion thereof with metallic electrode pads each located in a position corresponding to that of each of the bump pads of the LSI chip,
  each of the bump pads of the LSI chip being in pressure contact with each of the electrode pads of the interconnection substrate through an adhesive so that each of the bump electrodes is electrically connected to each of the electrode pads formed in the interconnection substrate,
  the adhesive having a thermal expansion coefficient ranging from 20 to 40 ppm when measured by TMA measurement, so that each of the bump pads and each of the electrodes pads formed on the multi-layer interconnection substrate is in electrical contact with each other within an elastic deformation range of each of said bump pads and electrode pads at a cooling lower limit temperature defined within a guaranteed temperature range of the semiconductor device,
  the organic portion having at a room temperature circumstance a storage elastic modulus ranging from 10 to 20 GPa when measured by DMA measurement,
  the organic portion further having a peak value of a loss coefficient, which peak value is equivalent to a glass transition temperature thereof, in a range of 100° C. to 250° C. when measured by the DMA measurement and having no peak value of the loss coefficient in another range of 0° C. to 100° C.

(5) A semiconductor device according to any one of the aspect (1) to (4), wherein the organic portion provided as the outermost layer of the multiple-layer interconnection substrate is formed of a build-up portion.

(6) A semiconductor device according to any one of the aspects (1) to (4), wherein the adhesive is an anisotropic conductive material in which conductive particles are mixed.

(7) A method of manufacturing a semiconductor device comprising at least one LSI chip provided on an electrode pad face thereof with metallic bump pads, and a multi-layer interconnection substrate having an outermost layer formed of an organic portion which substrate is provided on the organic portion thereof with metallic electrode pads each located in a position corresponding to that of each of said bump pads of the LSI chip, each of said bump pads of said LSI chip being in pressure contact with each of the electrode pads of the interconnection substrate through an adhesive so that each of the bump electrodes is electrically connected to each of the electrode pads formed in the interconnection substrate, the method comprising the steps of:

preparing the interconnection substrate having the organic portion having at a room temperature circumstance a storage elastic modulus ranging from 5 to 10 GPa when measured by DMA measurement, the organic portion further having a peak value of a loss coefficient, which peak value is equivalent to a glass transition temperature thereof, in a range of 100° C. to 250° C. when measured by the DMA measurement and having no peak value of said loss coefficient in another range of 0° C. to 100° C.;

pressure-bonding onto the electrode pads of the interconnection substrate the adhesive having a' thermal expansion coefficient ranging from 20 to 60 ppm when measured by TMA measurement so that each of said bump pads and each of the electrodes pads formed on the multi-layer interconnection substrate is in electrical contact with each other within an elastic deformation range of each of the bump pads and electrode pads at a cooling lower limit temperature defined within a guaranteed temperature range of said semiconductor device; and thermal-pressure-contacting each of the bump electrodes of the LSI chip and each of the electrode pads of the multi-layer interconnection substrate with each other and the curing the adhesive so that each of the bump electrodes of said LSI chip and each of said electrode pads of the multi-layer interconnection substrate are electrically connected to each other.

In the present specification, the "thermal pressure contact" or "thermal-pressure-contacting" means contacting under heating and pressure.

DETAILED DESCRIPTION OF THE INVENTION

First, a description will be given below regarding circumstances of the invention.

Figure 2:
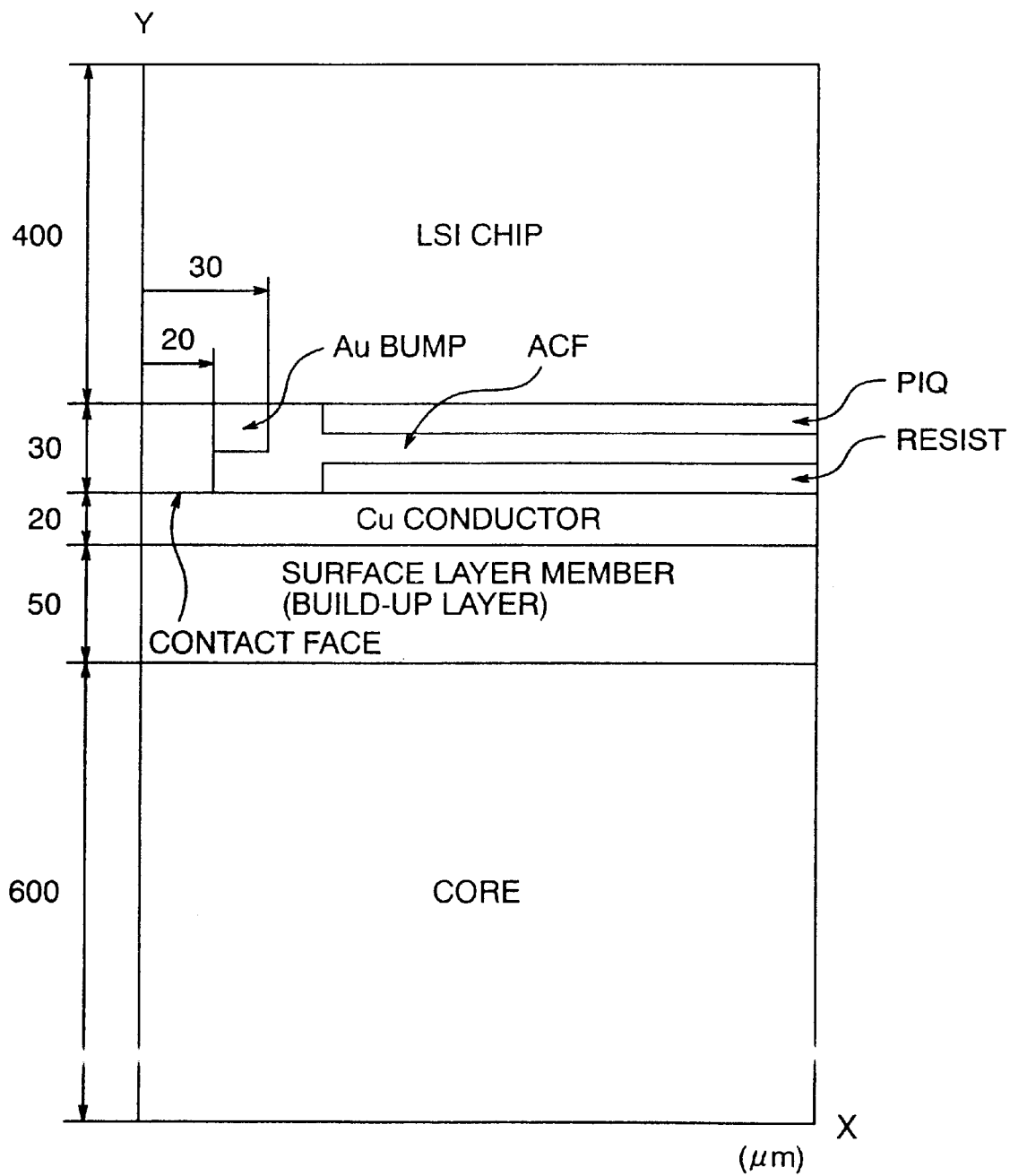
FIG. 2 is a schematic view showing an analysis model configuration used in a structural analysis for introducing the principle of the invention.

FIG. 2 is a schematic view of an analysis model obtained for researching the variation of a contact stress caused between each of bump pads and each of electrode pads formed on an interconnection substrate in accordance with a structural analysis based on a finite element method.

In FIG. 2, an analysis is performed on the basis of the contact analysis of a thermal elasticity and plasticity in a case where usually used gold bumps are used as the bump electrodes while assuming that both of an interconnection material (Cu) formed in a substrate side and each of the gold bumps are elasto-plastic bodies.

Figure 3:
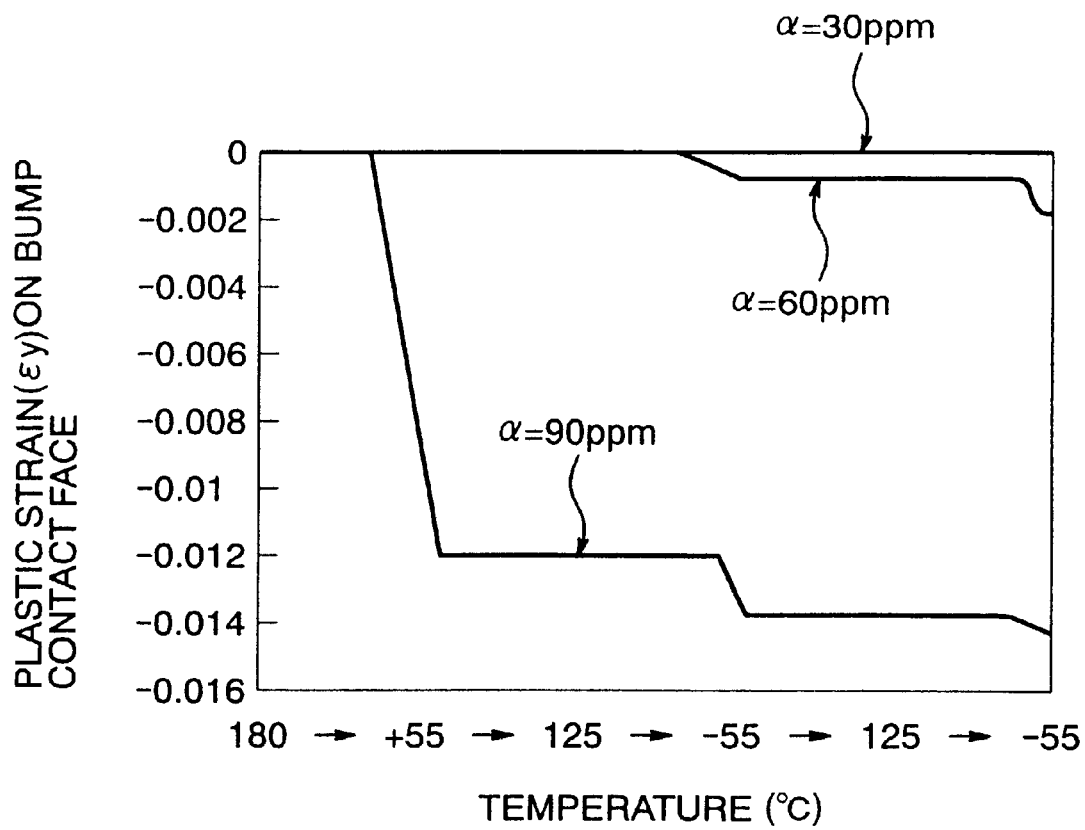
FIG. 3 is a graph showing an influence of an adhesive thermal expansion coefficient on the amount of a plastic strain caused in an Au bump electrode contact surface.

FIG. 3 is a graph showing a result of calculating a plastic strain caused on the gold bump contact surface at a cooling lower limit temperature of a usually performed temperature cycle condition (125° C. to −55° C.), in cases where the thermal expansion coefficients of the used adhesives are 30, 60 and 90 ppm which are representative values at temperatures not more than the glass transition temperature.

From FIG. 3, it is apparent that, by making the thermal expansion coefficient of the adhesive less than 60 ppm, the Au bump can be contacted within the range of the elastic deformation.

Namely, in a case where the thermal expansion coefficient is large, the plastic deformation of the Au bump is accelerated, and the contact pressure of the Au bump contact face is rapidly reduced simultaneously with the thermal expansion of the adhesive during a temperature rise occurring in an operation circumstance and in a reliability test, so that the disconnection occurs. Thus, the thermal expansion coefficient of the adhesive is required to be not more than 60 ppm.

However, since the contact pressure is generated on the Au bump contact face by the solidification shrinkage and thermal shrinkage of the adhesive, it is necessary that the thermal expansion coefficient of the adhesive is at least larger than that of the Au bump, so that the thermal expansion coefficient of the adhesive is needed to be not less than 20 ppm.

This result is obtained by analyzing a specific structure based on the analysis model. However, since, even in a case where each of the bump electrodes are formed to have a further small size in correspondence to a future, narrow pitch design of the bump electrodes, the mechanism similar to the above occurs in a further accelerated manner, it is an effective means that the physical property of the adhesive is limited to be within the above range.

Further, in a moisture absorption test, since the adhesive swells due to the moisture absorption with the result that both of the area of the Au bump contact face and the value of the contact pressure are reduced it is effective to make the thermal expansion of the adhesive low in view of this aspect.

In the analysis model shown in FIG. 2, it is supposed that a multiple-layered interconnection substrate having a build-up layer is used. As the value of the physical property of a usual build-up portion commercially available, the elastic modulus thereof according to the value shown in a catalogue is in the range of 1 to 2 MPa, that is, the build-up portion is formed of a material having low elasticity in comparison with a core material.

Figure 4:
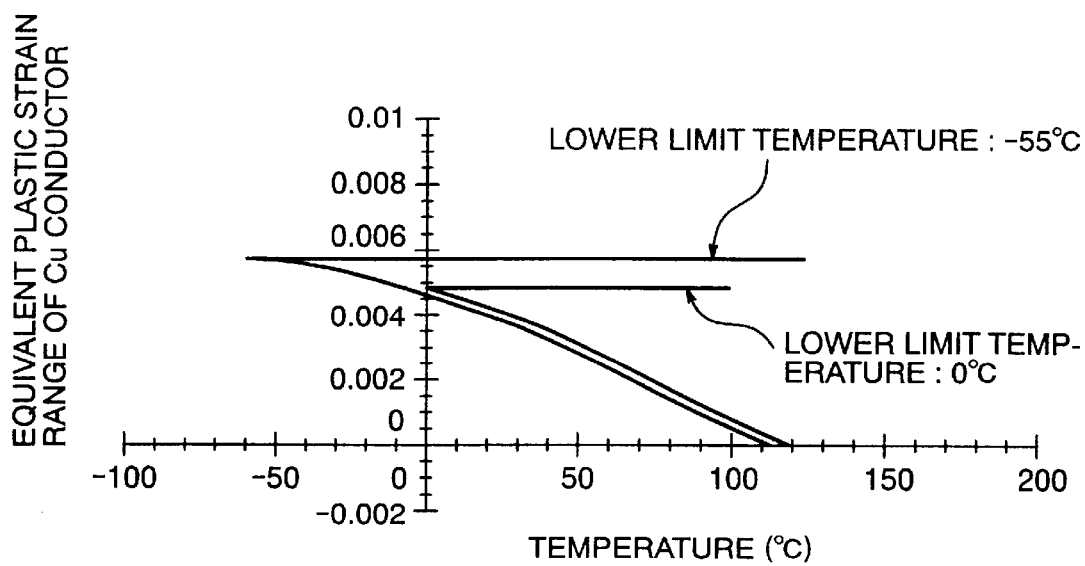
FIG. 4 is a graph showing the amount of a corresponding strain caused in a substrate electrode (Cu) contact surface (in the case of a build-up substrate having elastic modulus of 1 MPa)

FIG. 4 is a graph showing a result obtained by calculating a plastic strain caused in the electrode pad (Cu) contact face at the cooling lower limit temperature in a case where the elastic modulus of the build-up material is set to be 1 MPa.

In a case where the build-up portion used as an underlayer has a low elasticity, the deformation of the electrode pad becomes large even when the plastic deformation of the Au bump is restricted, and plastic deformation comes to occur in the portion of the electrode pads side.

Thus, it is an effective means that the contact pressure is maintained, at the lower limit temperature of the temperature cycle, within such a range as no plastic deformation occurs in both of the Au bump and the electrode pad. As the elastic modulus of the build-up portion for realizing the above, it is found, by means of the structural analysis, that the elastic modulus is needed to be at least 5 GPa in a case where the thermal expansion coefficient of the adhesive is not more than 60 ppm.

On the other hand, if the base build-up portion is too hard in hardness, the plastic deformation only in the Au bump side proceeds. In view of this, it is found that balancing the rigidity between the Au bump and the buid-up member is ideal.

In general, the elastic modulus of the Au bump varies in dependence on the kind thereof, however, it is within a range of about 7 to about 10 GPa, and the same level of elastic modulus is preferable as the physical property of the build-up portion. Accordingly, it arrives at the conclusion that the elastic modulus of the build-up portion ranging from 5 to 10 GPa is an effective means.

When the elastic modulus of the build-up portion comes to have such a high hardness level of 10 to 20 GPa as a conventional core material such as FR-4 has, the plastic deformation of the gold bump proceeds in an accelerated manner in the case where the thermal expansion coefficient of the adhesive is large, so that there occurs such a fear as the connection reliability is deteriorated in the temperature cycle test. However, since this phenomenon changes in dependence on the balance including the thermal expansion coefficient of the adhesive the connection reliability can be maintained at a sufficiently high level even in the case of the elastic modulus value corresponding to that of the conventional core material insofar as a combination with an adhesive is concerned which has such a low expansion coefficient as the thermal expansion coefficient of the adhesive is in the range not more than the level of 30 to 40 ppm at a temperature not more than the glass transition temperature thereof (in the case of the build-up material having elastic modulus of 10 to 20 GPa).

Figure 5:
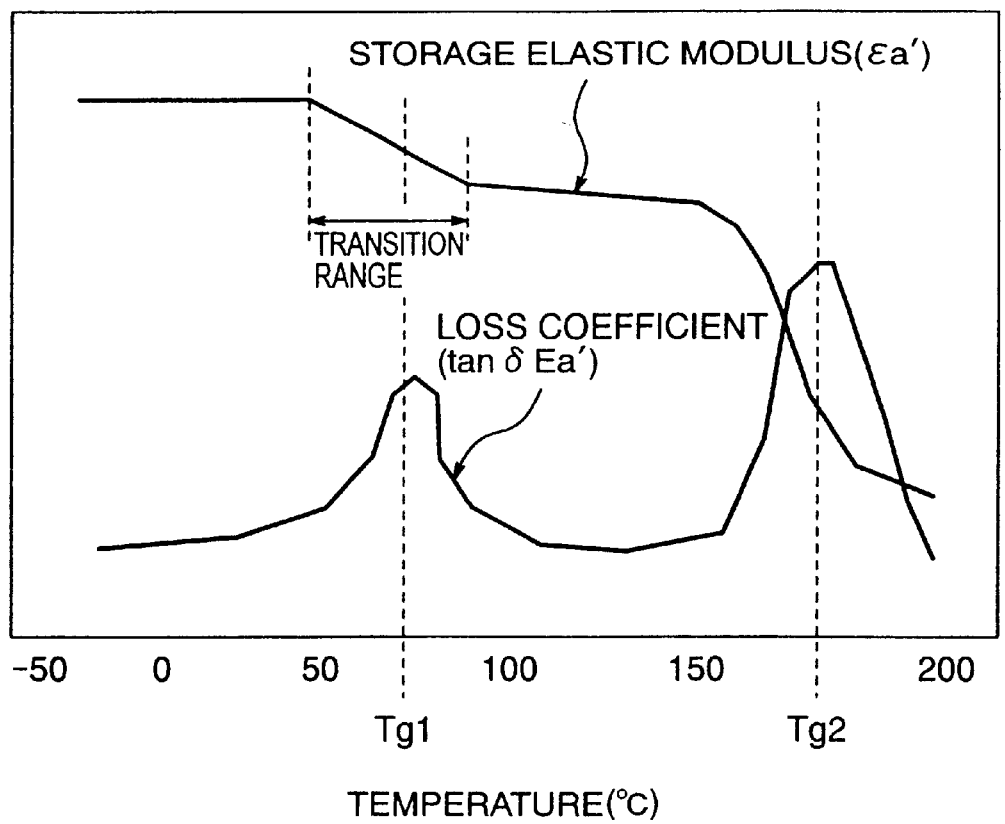
FIG. 5 is a graph showing a measurement example of a storage elastic modulus and a loss coefficient which measurement is obtained by DMA measurement of the build-up portion.

FIG. 5 is a graph schematically showing a general example of a storage elastic modulus and a loss coefficient obtained by DMA measurement of the build-up portion. The build-up portion is formed by mixing a flexibilizer in a base material, so that, in addition to a glass transition temperature Tg2 (a peak of a loss coefficient)of an epoxy material, it is general that another glass transition temperature Tg1 of a low temperature side emerges in a range between 70 and 80° C. due to the influence of the flexibilizer.

In the case of taking the reliability of the substrate itself into consideration, it is effective means that the glass transition temperature is present in a low temperature side, whereby the elastic modulus is reduced to thereby relieve the stress occurring among the substrate-constituting materials.

Or, in a conventional flip-chip mounting by use of C4 bumps, since the structure of a semiconductor device is provided by mechanical bonding through solder bumps and by reinforcing it by an underfill, the respect that the outermost layer of the substrate is made to have a low elasticity while the glass transition temperature is present at a low temperature becomes means effective to keep the connection reliability.

However, in the mounting structure relating to the invention in which the electric connection is performed by the contact pressure present between each of the Au bumps and each of the electrode pads formed on the substrate, it means the holding of a semiconductor device in the vicinity of the transition range of the build-up portion to hold the structure at a temperature near 85° C. corresponding to the temperature of operating circumstances of the semiconductor device or the temperature of a usually performed heat proof and moisture proof test in which the semiconductor device is left at the high temperature or is exposed to the high temperature and to a high moisture.

Accordingly, the contact pressure occurring between the Au bumps and the electrode pads is necessarily reduced gradually with the lapse of time due to the stress relaxation "b" caused by a visco-elasticity effect in the transition range of the build-up portion, which comes to deteriorate the bonding reliability.

Figure 6:
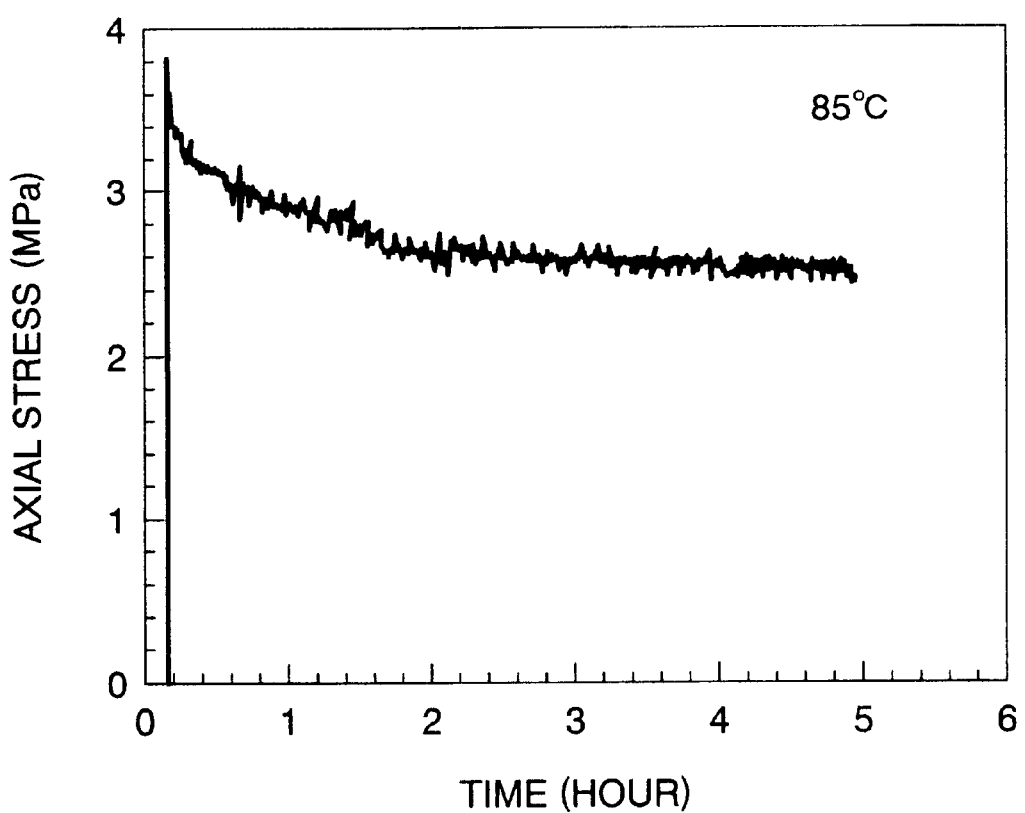
FIG. 6 is a graph showing an example of a stress relaxation measurement performed after keeping a pre-strain in the build-up portion.

FIG. 6 shows a result obtained by experiments regarding stress variation performed by the steps of applying at 85° C. a tensile pre-strain to the build-up portion having the physical property shown in FIG. 5 and calculating the stress variation occurring at 85° C. when holding the build-up portion at a deformed state. As shown in FIG. 6, a stress relaxation at a level of about 60% of the initial stress is caused by holding only for about five hours. Further, due to the decrease effect of the elastic modulus in addition to the relaxing of the stress, it is deemed that the contact pressure is reduced to the level of about 50% of the initial value achieved at the room temperature by holding only for five hours at 85° C.

Thus, the inventors of the invention come to have the conclusion that, in the mounting structure in which the electric connection is performed by the contact pressure, it is effective to use the multi-layered build-up substrate having a build-up portion which does not contain any flexibizer having the glass transition temperature not more than 100° C. (, that is, the glass transition temperature Tg1 is not present at a temperature not more than 100° C.), which is distinct to the common sense of the prior arts.

Next, a description will be given of a specific embodiment according to the invention which is realized on the basis of the researches and analysis explained above.

Figure 1:
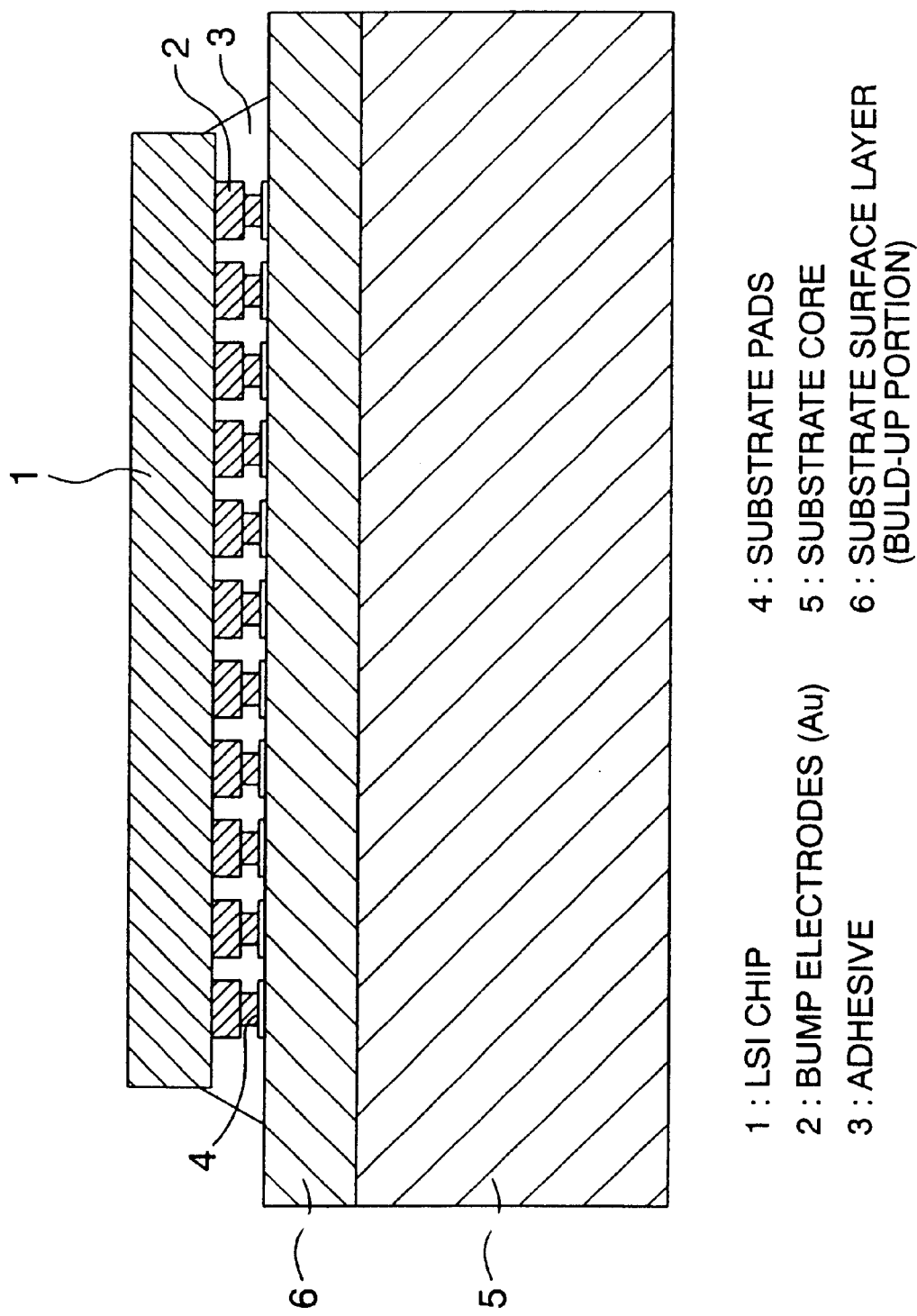
FIG. 1 is a cross sectional view of a semiconductor device according to an embodiment of the invention.

FIG. 1 is a cross sectional view of a semiconductor mounting structure according to an embodiment of the present invention.

In FIG. 1, each of bump pads 2 made of a metal is formed on each of aluminum electrode pads of an LSI chip 1. It is preferred that the bump pads 2 are made of gold (Au) because a contact surface is needed not to be oxidized and because in a case of Au the bump pads can be formed by a ball bonding technique or a plating technique which is excellent in mass-productivity. In the embodiment of the invention, there is shown a case of mounting by using gold bumps formed through a stud bumping technique.

The size of the Au bump pads varies in dependence on the pitch of electrode pads of the product chip, however, in a product having a pitch of 50 to 100 $\mu$m, a bump diameter ranging from about 40 to 60 $\mu$m is preferred, and a height of the bump electrodes after being mounted is made to be preferably in the range of about 20 to 30 $\mu$m.

As regards the mounting substrate, it is in general necessary for the substrate to have a thermal conformity required in the case of the secondary mounting thereof performed onto an organic substrate such as FR-4 or the like usually used as a mother board of a product equipment, and it is in general necessary for the substrate to be usable even in a case of a narrow pitch. In taking these requirements into account, it is hard, in the view point of an actual production process, to keep both of lines and spaces while providing the above-described pad pitch, insofar as a laminate type substrate such as FR-4 currently used is concerned.

Accordingly, a build-up type substate is used properly in the existing circumstances, in which substrate interconnection layers are stacked on the upper layer of a core material through the build-up portion, and the invention is particularly effective in the case of mounting on the organic substrate described above.

The build-up portion 6 is made of 2 to 3 layers stacked with each other on the upper layer of the core portion of the substrate, each of which layers has a thickness of about 30 μm, and an interconnection layer is formed. On the outermost layer of the substrate are formed electrode pads 4, to the area of which pads is temporarily pressure-bonded an adhesive 3 of a sheet shape having a thickness of about 30 to 50 μm. Further, each of the bump pads 2 formed on the LSI chip 1 is located at a position corresponding to each of the electrode pads 4 formed on the build-up layer 6, and they are mounted by the contacting under heating and pressure at a temperature between about 180° C. and about 250° C.

At the time of this contacting, the bump electrodes 2 are deformed by the load of the contacting under heating and pressure so that the bump electrodes 2 may conform to the evenness of the mounting surface of the substrate, and in this deformation state of the bump electrodes 2 the adhesive 3 is solidified while coming to have such a shape as to seal at a time the peripheral area of the group of the bump electrodes 2 as well as all of the bump electrodes.

Thus, the group of bump electrodes 2 formed on the LSI chip 1 are electrically connected to the group of the electrode pads 4 formed on the interconnection substrate by residual stress occurring after the thermal pressure contact and by the thermal shrinkage and solidified shrinkage of the adhesive 3.

In this case, as the material of the adhesive 3, it is preferred to use an epoxy thermosetting resin having a high bonding reliability and having a relatively small thermal expansion coefficient, and it is possible to make this resin anisotropic by mixing therein conductive particles (or called a "filler") such as, for example, nickel (Ni) or the like to thereby improve the margin of the electric bonding reliability.

In the semiconductor mounting structure manufactured by the manufacturing process described above, there are three requisites (1) to (3) regarding the physical properties of the elements used therein.

(1) The adhesive 3 used for the filling for achieving the electric connection between each of the bump electrodes 2 and each of the electrode pads formed on the substrate is one having an average thermal expansion coefficient not less than 20 ppm but not more than 60 ppm at a temperature not more than the glass transition temperature of the adhesive 3 when measured by use of a thermomechanical analyzer (TMA).

(2) The organic portion 6 (, that is, the build-up portion in the embodiment of the invention) located on the outermost portion of the substrate onto which the LSI chip is mounted is one having a storage elastic modulus Ea' of 5 to 10 GPa at a room temperature (10° C.) and preferably not less than 5 GPa in a range of the room temperature to 100° C. when measured through DMA (Determination of Dynamic Mechanical Property belonging to ISO standard 6721-1 to 7).

(3) The organic portion 6 (, that is, the build-up portion in the embodiment of the invention) located on the outermost portion of the multi-layered substrate onto which the LSI chip is mounted is one having a loss coefficient tan δEa' having a peak value in a range of 100° C. to 250° C. but having no peak value in another range of 0° C. to 100° C. when measured through the DMA.

When the semiconductor device is manufactured in accordance with the manufacturing method in which all of the requisites (1) to (3) regarding the physical properties described above are satisfied, the semiconductor device can exert the maximum performance.

That is, the method according to the invention for producing the semiconductor device comprises the steps of: preparing the multi-layered interconnection substrate provided with the outermost layer onto which the electrode pads 4 are formed and which is made of the organic portion 6 having both of the storage elastic modulus of 5 to 10 GPa at the room temperature circumstance and the loss coefficient with a peak value in a range of 100° C. to 250° C. but no peak value in another range of 0° C. to 100° C. when measured through the DMA; pressure-bonding, at a cooling lower limit temperature predetermined in the guaranteed temperature range of the semiconductor device, the adhesive 3 having the thermal expansion coefficient of 20 to 60 ppm when measured through the TMA measurement so that each of the bump electrodes 2 and the electrode pads 4 are in electrical contact with each other within the elastic deformation range thereof; thermal-pressure-contacting each of the bump electrodes 2 of the LSI chip 1 and each of the electrode pads 4 of the multi-layer interconnection substrate 5 with each other; and curing the adhesive 3 so that each of the bump electrodes 2 is electrically connected to each of the electrode pads 4.

As disclosed above, according to the embodiment of the invention, the thermal expansion coefficient of the adhesive 3 is selected to be in the range of 20 ppm to 60 ppm, the elastic modulus of the build-up portion 6 being selected to be in the range of 5 GPa to 10 Gpa, and the build-up portion 6 formed in the multi-layer interconnection substrate is made to have the peak value (the glass transition temperature) of the loss coefficient thereof in the range of 100° C. to 250° C. and is made not to have any peak value in the range of 0° C. to 100° C., whereby it becomes possible to realize the semiconductor device having the high reliability within the guaranteed temperature range thereof with respect to the electrical connection achieved between each of the bump electrodes formed on the LSI chip and the electrode pads formed on the interconnection substrate and to realize the method of producing this semiconductor device.

In the embodiment described above, all of the requisites (1) to (3) are satisfied, however, it is possible to obtain sufficient improvement even in the case where only the requisites (1) and (2) or only the requisites (1) and (3) are satisfied.

In the case where only the requisites (1) and (3) are satisfied, it is preferred that the elastic modulus of the build-up portion 6 is in the range of 1 to 20 GPa, and the thermal expansion coefficient of the adhesive 3 at a temperature not more than the glass transition temperature of the adhesive 3 is in the range of 20 to 40 ppm.

Since in the embodiment of the invention is used the substrate having the core portion and the build-up portion, the physical property of the substrate for achieving the invention is limited to be one of the build-up portion. However, even in a future case where the structure of a substrate capable of being used in the narrow pitch design is changed because of the progress of substrate technique, it is possible to obtain an effect similar to the above advantage insofar as the physical property of the organic portion forming the surface layer of the substrate satisfies the requisites described above (, which is the essence of the invention).

In the invention, the mounting structure of the semiconductor device in which the electric connection is achieved by the contact pressure occurring between each of the bump pads formed on the LSI and each of the electrode pads formed on the substrate onto which the semiconductor is mounted, is made to satisfy all of the following three requisites (1) to (3) or the requisites (1) and (3) or the requisites (1) and (2):

(1) the thermal expansion coefficient of the adhesive 3 is in the range of 20 ppm to 60 ppm;
(2) the elastic modulus of the build-up portion 6 is in the range of 5 GPa to 10 GPa;
(3) the peak value (the glass transition temperature) of the loss coefficient of the build-up portion 6 is present in a range of 100° C. to 250° C. but is not present in another range of 0° C. to 100° C., whereby it becomes possible to realize a semiconductor device capable of keeping with high reliability in the range of the guaranteed temperature the electric connection between each of the bump electrodes formed on the LSI chip and each of the electrode pads formed on the interconnection substrate and to realize the method of producing the semiconductor device.

What is claimed is:

1. A semiconductor device comprising at least one LSI chip provided on an electrode pad face thereof with metallic bump pads, and a multi-layer interconnection substrate having an outermost layer formed of an organic portion whereon said substrate with metallic electrode pads each located in a position corresponding to that of each of said bump pads of the LSI chip, each of said bump pads of said LSI chip being in pressure contact with each of the electrode pads of the interconnection substrate through an adhesive so that each of the bump electrodes is electrically connected to each of the electrode pads formed in the interconnection substrate, said adhesive having a thermal expansion coefficient ranging from 20 to 40 ppm when measured by TMA measurement, so that each of said bump pads and each of the electrodes pads formed on the multi-layer interconnection substrate is in electrical contact with each other within an elastic deformation range of each of said bump pads and electrode pads at a cooling lower limit temperature defined within a guaranteed temperature range of said semiconductor device, said organic portion having at a room temperature circumstance a storage elastic modulus ranging from 10 to 20 GPa when measured by DMA measurement, said organic portion further having a peak value of a loss coefficient, which peak value is equivalent to a glass transition temperature thereof, in a range of 100° C. to 250° C. when measured by the DMA measurement and having no peak value of said loss coefficient in another range of 0° C. to 100° C.

2. A semiconductor device according to claim 1, wherein the organic portion provided as the outermost layer of said multiple-layer interconnection substrate is formed of a build-up portion.

3. A semiconductor device according to claim 1, wherein said adhesive is an anisotropic conductive material in which a conductive powder is mixed.

4. A semiconductor device comprising at least one LSI chip provided on an electrode pad face thereof with metallic bump pads, and a multi-layer interconnection substrate having an outermost layer formed of an organic portion, said substrate being provided with metallic electrode pads each located in a position corresponding to that of each of said bump pads of the LSI chip, each of said bump pads of said LSI chip being in pressure contact with each of the electrode pads of the interconnection substrate through an adhesive so that each of the bump electrodes is electrically connected to each of the electrode pads formed in the interconnection substrate, said adhesive having a thermal expansion coefficient ranging from 20 to 60 ppm when measured by TMA measurement, so that each of said bump pads and each of the electrodes pads formed on the multi-layer interconnection substrate is in electrical contact with each other within an elastic deformation range of each of said bump pads and electrode pads at a cooling lower limit temperature defined within a guaranteed temperature range of said semiconductor device, said organic portion having at a room temperature circumstance a storage elastic modulus ranging from 5 to 10 GPa when measured by DMA measurement.

5. A semiconductor device according to claim 4, wherein the organic portion provided as the outermost layer of said multiple-layer interconnection substrate is formed of a build-up portion.

6. A semiconductor device according to claim 4, wherein said adhesive is an anisotropic conductive material in which a conductive powder is mixed.

7. A semiconductor device comprising at least one LSI chip provided on an electrode pad face thereof with metallic bump pads, and a multi-layer interconnection substrate having an outermost layer formed of an organic portion, said substrate being with metallic electrode pads each located in a position corresponding to that of each of said bump pads of the LSI chip, each of said bump pads of said LSI chip being in pressure contact with each of the electrode pads of the interconnection substrate through an adhesive so that each of the bump electrodes is electrically connected to each of the electrode pads formed in the interconnection substrate, said adhesive having a thermal expansion coefficient ranging from 20 to 60 ppm when measured by TMA measurement, so that each of said bump pads and each of the electrodes pads formed on the multi-layer interconnection substrate is in electrical contact with each other within an elastic deformation range of each of said bump pads and electrode pads at a cooling lower limit temperature defined within a guaranteed temperature range of said semiconductor device, said organic portion having a peak value of a loss coefficient, which peak value is equivalent to a glass transition temperature thereof, in a range of 100° C. to 250° C. when measured by the DMA measurement and having no peak value of said loss coefficient in another range of 0° C. to 100° C.

8. A semiconductor device according to claim 7, wherein the organic portion provided as the outermost layer of said multiple-layer interconnection substrate is formed of a build-up portion.

9. A semiconductor device according to claim 7, wherein said adhesive is an anisotropic conductive material in which a conductive powder is mixed.

10. A semiconductor device comprising
at least one LSI chip provided on an electrode pad face thereof with metallic bump pads, and
a multi-layer interconnection substrate having an outermost layer formed of an organic portion, said substrate being provided with metallic electrode pads each located in a position corresponding to that of each of said bump pads of the LSI chip,
each of said bump pads of said LSI chip being in pressure contact with each of the electrode pads of the interconnection substrate through an adhesive so that each of the bump electrodes is electrically connected to each of the electrode pads formed in the interconnection substrate,
said adhesive having a thermal expansion coefficient ranging from 20 to 60 ppm when measured by TMA measurement, so that each of said bump pads and each of the electrodes pads formed on the multi-layer interconnection substrate is in electrical contact with each other within an elastic deformation range of each of said bump pads and electrode pads at a cooling lower limit temperature defined within a guaranteed temperature range of said semiconductor device,
said organic portion having at a room temperature circumstance a storage elastic modulus ranging from 5 to 10 GPa when measured by DMA measurement,
said organic portion further having a peak value of a loss coefficient, which peak value is equivalent to a glass transition temperature thereof, in a range of 100° C. to 250° C. when measured by the DMA measurement and having no peak value of said loss coefficient in another range of 0° C. to 100° C.

11. A semiconductor device according to claim 1, wherein the organic portion provided as the outermost layer of said multiple-layer interconnection substrate is formed of a build-up portion.

12. A semiconductor device according to claim 10, wherein said adhesive is an anisotropic conductive material in which a conductive powder is mixed.

* * * * *